US 6,541,330 B1

(12) United States Patent
Lee et al.

(10) Patent No.: US 6,541,330 B1
(45) Date of Patent: Apr. 1, 2003

(54) CAPACITOR FOR SEMICONDUCTOR MEMORY DEVICE AND METHOD OF MANUFACTURING THE SAME

(75) Inventors: Kee Jeung Lee, Seoul (KR); Tae Hyeok Lee, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 3 days.

(21) Appl. No.: 09/609,559

(22) Filed: Jun. 30, 2000

(30) Foreign Application Priority Data

Jul. 1, 1999 (KR) .............................. 99-26403

(51) Int. Cl.[7] ........................................ H01L 21/8242
(52) U.S. Cl. ...................... 438/240; 438/3; 438/238; 438/280; 438/393
(58) Field of Search ................. 438/240, 393, 438/3, 238, 280, 241

(56) References Cited

U.S. PATENT DOCUMENTS

| 4,130,694 | A |   | 12/1978 | Glass et al. ................. 429/193 |
|---|---|---|---|---|
| 5,352,623 | A |   | 10/1994 | Kamiyama .................. 438/396 |
| 5,452,178 | A |   | 9/1995 | Emesh et al. ................ 361/303 |
| 5,631,188 | A |   | 5/1997 | Chang et al. ................ 438/253 |
| 5,677,015 | A |   | 10/1997 | Hasegawa .................. 427/576 |
| 5,741,721 | A |   | 4/1998 | Stevens ...................... 437/60 |
| 5,753,945 | A |   | 5/1998 | Chivukula et al. .......... 257/295 |
| 5,763,300 | A |   | 6/1998 | Park et al. .................. 438/240 |
| 5,776,660 | A |   | 7/1998 | Hakey et al. ............... 430/296 |
| 5,837,576 | A |   | 11/1998 | Chen et al. ................. 438/253 |
| 5,859,760 | A |   | 1/1999 | Park et al. .................. 361/313 |
| 5,872,415 | A |   | 2/1999 | Dreifus et al. .............. 310/311 |
| 5,910,880 | A |   | 6/1999 | DeBoer et al. ............. 361/311 |
| 5,936,831 | A |   | 8/1999 | Kola et al. .................. 361/303 |
| 5,977,582 | A |   | 11/1999 | Fleming et al. ............. 257/310 |
| 5,980,977 | A |   | 11/1999 | Deng et al. .................. 427/79 |
| 5,985,730 | A | * | 11/1999 | Lim .............................. 438/393 |
| 6,130,124 | A | * | 10/2000 | Lee .............................. 438/240 |
| 6,150,183 | A | * | 11/2000 | Fukuda et al. ................. 438/3 |
| 6,200,847 | B1 | * | 3/2001 | Kishiro ........................ 438/240 |
| 6,207,489 | B1 | * | 3/2001 | Nam et al. ................... 438/240 |
| 6,340,622 | B1 | * | 1/2002 | Lee et al. ...................... 438/20 |

FOREIGN PATENT DOCUMENTS

| JP | 62136035 | 6/1987 |
|---|---|---|
| JP | 63038248 | 2/1988 |
| JP | 01173622 | 7/1989 |
| JP | 02226754 | 9/1990 |
| JP | 05167008 | 7/1993 |
| JP | 05335483 | 12/1993 |
| JP | 06163819 | 6/1994 |
| JP | 07014993 | 1/1995 |
| JP | 07045467 | 2/1995 |
| JP | 11191612 | 7/1999 |
| JP | 11233723 | 8/1999 |

* cited by examiner

*Primary Examiner*—Michael S. Lebentritt
*Assistant Examiner*—Pho Luu
(74) *Attorney, Agent, or Firm*—Pillsbury Winthrop LLP

(57) ABSTRACT

Disclosed are a capacitor for semiconductor device capable of increasing storage capacitance and preventing leakage current, and method of manufacturing the same. According to the present invention. A lower electrode is formed on a semiconductor substrate. The lower electrode is surface-treated so as to prevent generation of a natural oxide layer. An amorphous TaON layer is, as a dielectric layer, deposited on the upper part of the lower electrode. Afterwards, the amorphous TaON layer is thermal-treated in a range of maintaining its amorphous state. Next, an upper electrode is formed on the upper part of the TaON layer.

21 Claims, 2 Drawing Sheets

US 6,541,330 B1

CAPACITOR FOR SEMICONDUCTOR MEMORY DEVICE AND METHOD OF MANUFACTURING THE SAME

FIELD OF THE INVENTION

The present invention relates to a capacitor for semiconductor memory device and a method of manufacturing the same, and more particularly to a capacitor for semiconductor memory device with a dielectric layer having low leakage current and high dielectric constant and method of manufacturing the same.

BACKGROUND OF THE INVENTION

Along with the recent progress in the semiconductor manufacturing technology, the demand for memory device has increased dramatically. Consequently, a memory device having higher capacitance per small dimension is required. Capacitance of the capacitor is increased by using an insulator having high dielectric constant or enlarging the surface area of a lower electrode. Those conventional capacitors have used $Ta_2O_5$ layer having a dielectric constant higher than that of nitride-oxide(NO) layer as a dielectric, thereby forming the lower electrode having 3-Dimensional structure.

FIG. 1 is a cross-sectional view showing a capacitor in a conventional semiconductor memory device. Referring to FIG. 1, a gate electrode 13 including a gate insulating layer 12 at a lower portion thereof is formed by a known technique on an upper part of a semiconductor substrate 10 which a field oxide layer 11 is formed at a selected portion thereof. A junction region 14 is formed on the semiconductor substrate 10 at both sides of the gate electrode 13, thereby forming an MOS transistor. A first interlevel insulating layer 16 and a second interlevel insulating layer 18 are formed on the upper part of the semiconductor substrate 10 on which the MOS transistor has been formed. A storage-node contact hole h is formed in the first and the second interlevel insulating layers 16 and 18 so that the junction region 14 is exposed. A cylinder type lower electrode 20 is formed by a known technology in a storage-node contact hole h to be contact with the exposed junction region 14. A hemi-Spherical grain(HSG) layer 21 is formed on the surface of the lower electrode 20 in order to increase the surface area of the lower substrate 20. A $Ta_2O_5$ layer 23 is formed on the surface of the HSG layer 21. At this time, the $Ta_2O_5$ layer 23 is formed as follows. First, a surface of the HSG layer 21 is cleaned before the $Ta_2O_5$ layer 23 is formed, and then the RTN(rapid thermal nitridation) process is performed ex situ, thereby forming a silicon-nitride layer 22 on the surface of the HSG layer 21. Next, a first $Ta_2O_5$ layer is formed at a temperature of approximately 400~450° C. to thickness of 53~57 Å. Afterward, an annealing process is performed at low temperature, and then a second $Ta_2O_5$ layer is formed to the same thickness and by the same process as in the first $Ta_2O_5$ layer. Annealing processes at low temperature and at high temperature are continued in series, thereby forming a single $Ta_2O_5$ layer 23. An upper electrode 24 is deposited on upper parts of the $Ta_2O_5$ layer 23 and the second interlevel insulating layer 18, thereby completing the formation of a capacitor.

However, the conventional capacitor formed according to the above method using the $Ta_2O_5$ layer as a dielectric layer has the following problems.

First, a difference in the composition rate of Ta and O is generated since the general $Ta_2O_5$ layer has unstable stoichiometry. As a result, substitutional Ta atoms, i.e. vacancy atoms, are generated in the thin film. Since those vacancy atoms are oxygen vacancies, leakage current is generated. The amount of vacancy atoms can be controlled depending on the contents and the bond strength of components in the $Ta_2O_5$ layer; however, it is difficult to eliminate them completely.

In order to stabilize the unstable stoichiometry of the $Ta_2O_5$ layer, the $Ta_2O_5$ layer is oxidized so as to remove the substitutional Ta atoms in the $Ta_2O_5$ layer. However, when the $Ta_2O_5$ layer is oxidized, the following problems occur. That is, the $Ta_2O_5$ layer has high oxide reaction with an upper electrode and a lower electrode formed of polysilicon or TiN and so forth. Therefore, in an oxide process to oxidize the substitutional Ta atoms, an oxide layer having a low dielectric constant is formed at an interface since the $Ta_2O_5$ layer and the upper electrode or the lower electrode react to one another, and oxygen moves to the interface between the $Ta_2O_5$ layer and the lower electrode, thereby deteriorating the homogeneity of the interface.

Further, since an organic substance such as $Ta(OC_2H_5)_5$ used as a precursor has a large amount of carbon components, impurities such as carbon atoms C, carbon compounds($CH_4$, $C_2H_4$) and $H_2O$ result in the $Ta_2O_5$ layer. These impurities increase leakage current in the capacitor and degrade the dielectric characteristics of the $Ta_2O_5$ layer. Accordingly, a capacitor having a large capacitance is difficult to obtain.

Moreover, using the $Ta_2O_5$ layer as a dielectric layer increases extra ex-situ steps, i.e. one before formation of $Ta_2O_5$ layer and one after the cleaning step. Also, two steps of $Ta_2O_5$ deposition should be applied to the formation of the $Ta_2O_5$ layer, and two thermal processes at low and high temperatures are performed after the $Ta_2O_5$ layer has been formed. Therefore, forming a dielectric layer with $Ta_2O_5$ using the conventional method is cumbersome.

SUMMARY OF THE INVENTION

Accordingly, it is one object of the present invention to provide a capacitor for semiconductor device capable of obtaining a great capacitance by providing a dielectric layer having low leakage current and high dielectric constant.

Furthermore, the other object of the present invention is to provide a method of manufacturing capacitor for semiconductor device capable of simplifying manufacturing process thereof.

According to one embodiment of the present invention, a capacitor on a semiconductor substrate includes: a lower electrode; a dielectric layer formed on the lower electrode; and an upper electrode formed on the upper part of the dielectric layer, wherein the dielectric layer is an amorphous TaON layer.

In another aspect of the present invention, the present invention provides a method of forming a capacitor for semiconductor memory device including the steps of: forming a lower electrode on the semiconductor substrate; depositing an amorphous TaON layer as a dielectric layer on the upper part of the lower electrode; thermal-treating the amorphous TaON layer in a range of maintaining the amorphous state; and forming an upper electrode on the upper part of the TaON layer.

Still another aspect of the present invention, the present invention provides a method of forming a capacitor for semiconductor memory device including the steps of: forming a lower electrode on the semiconductor substrate; surface-treating the lower electrode; depositing an amorphous TaON layer as a dielectric layer on the upper part of the lower electrode; thermal-treating the amorphous TaON layer in a range of maintaining the amorphous state; and forming an upper electrode on the upper part of the TaON layer, wherein the amorphous TaON layer is formed by a wafer surface chemical reaction of a Ta chemical vapor obtained from a precursor, $O_2$ gas and $NH_3$ gas with pressure of 0.1 to 100 Torr at a temperature of 300 to 600° C. in an LPCVD chamber.

DETAILED DESCRIPTION OF THE PREFERRED EMBODIMENTS

Figure 1:
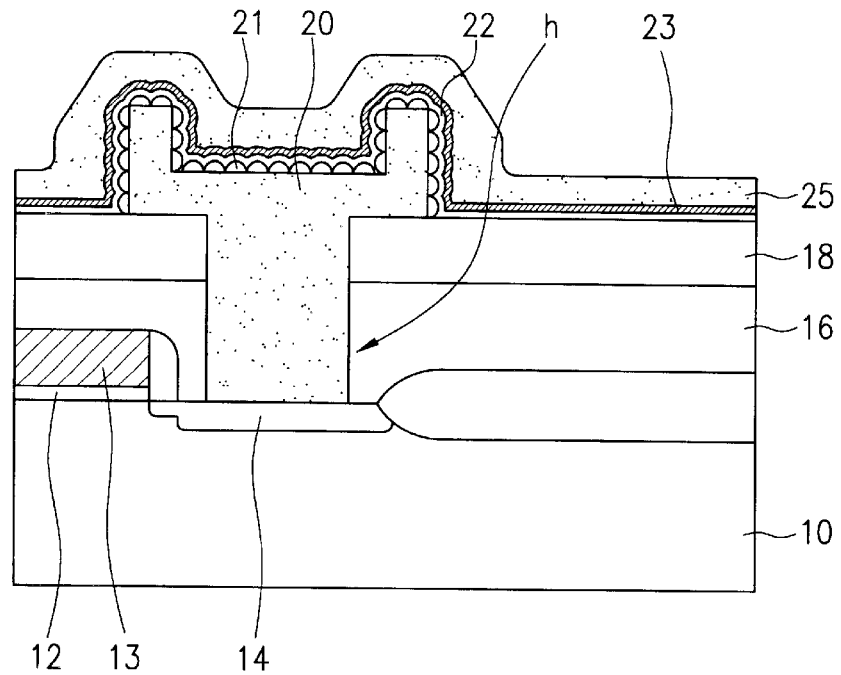
FIG. 1 is a cross-sectional view for showing a conventional capacitor for semiconductor device.
Figure 2A:
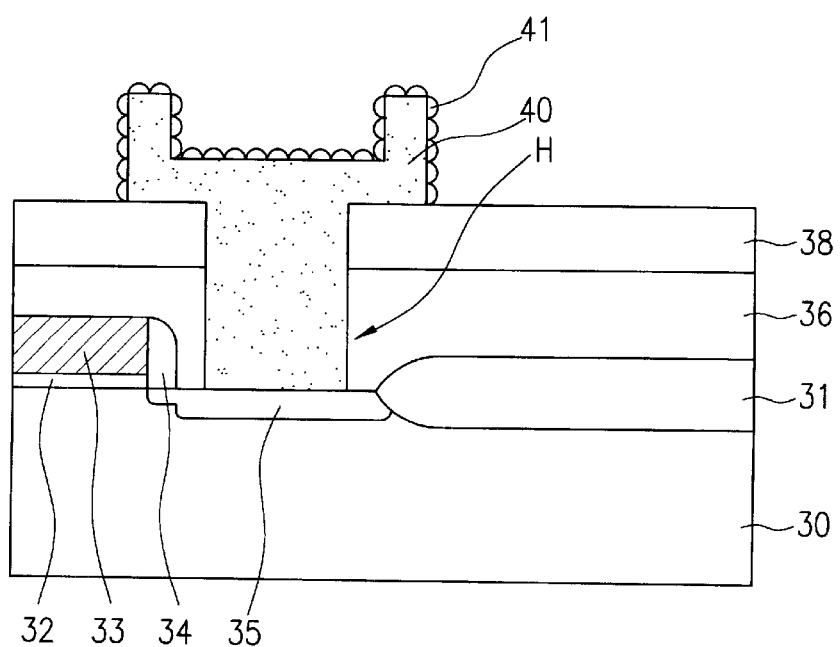
FIGS. 2A to 2C are cross-sectional views of each process for describing a method of manufacturing a capacitor for semiconductor device according to the present invention.

Referring to FIG. 2A, a field oxide layer 31 is formed according to a known method at a selected portion of a semiconductor substrate 30 having a selected conductivity. A gate electrode 33 having a gate insulating layer 32 at a lower portion thereof is formed at a selected portion of the upper part of the semiconductor substrate 30, and a spacer 34 is formed according to a known method at both side-walls of the gate electrode 33. A junction region 35 is formed on both sides of the gate electrode 33 of the semiconductor substrate 30, thereby forming an MOS transistor. A first interlevel insulating layer 36 and a second interlevel insulating layer 38 are formed at the semiconductor substrate 30 in which the MOS transistor is formed. Afterward, the second and the first interlevel insulating layers 38,36 are patterned so that a selected portion of the junction region 35 is exposed, thereby forming a storage node contact hole H. A lower electrode 40 of cylinder type or stack type is formed to be in contact with the exposed junction region 35. An HSG layer 41 for enlarging the surface area of the lower electrode 40 is formed according to a known method on the surface of the lower electrode 40. Afterwards, to prevent a low dielectric oxide layer from generating on the surface of the HSG layer 41, i.e. the interface between the lower electrode 40 including the HSG layer 41 and a dielectric layer(not illustrated) which will be formed later, the lower electrode 40 and the second interlevel insulating layer 38 are cleaned by using HF vapor, HF solution and a compound containing HF. This cleaning-treatment can be performed in situ or ex situ. In addition, the surface of the HSG layer 41 can be interface-treated by using $NH_4OH$, or $H_2SO_4$ and so forth to improve the homogeneity of the interface before or after cleaning a naturally generated low dielectric oxide layer.

Figure 2B:
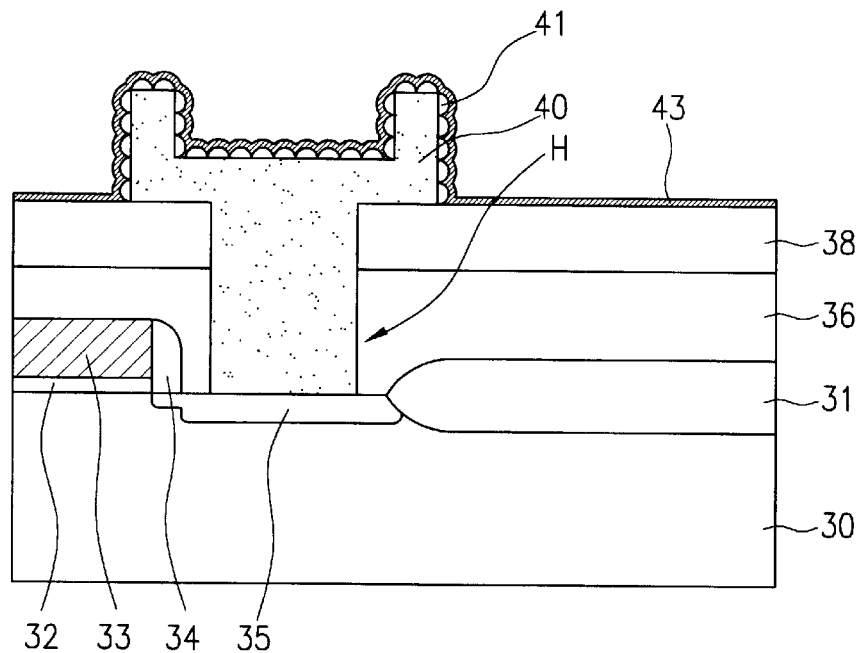

Referring to FIG. 2B, as a dielectric, an amorphous TaON layer 43 is formed on the upper part of the lower electrode 40. The amorphous TaON layer 43 in the present invention is formed in the LPCVD chamber maintaining 300 to 500° C. with pressure of less than 100 torr. The amorphous TaON layer 43 is formed by a chemical reaction of Ta chemical vapor, $O_2$ gas and $NH_3$ gas on the wafer surface in a state of restraint of gas phase reaction in order to minimize residue impurities therein. Here, the Ta chemical vapor is formed by evaporating an organic metal precursor including tantalum such as $Ta(OC_2H_5)_5$(tantalum ethylate) and $Ta(N(CH_3)_2)_5$ (penta-dimethyl-amino-tantalum). That is, an amount of the precursor selected using a flow controller such as MFC (mass flow controller) is flowed and evaporated in an evaporizer or evaporation tube including an orifice or a nozzle, thereby generating the Ta chemical vapor. At this time, the temperature of a conduit coupled to the chamber that is a flow path of the evaporizer or Ta vapor, is preferably maintained at 150 to 200° C. so as to prevent condensation of the Ta chemical vapor, and it is appropriate that the amount of the precursor supplied in the evaporizer or evaporation tube is 50 to 300 mg/min. And, $O_2$ gas and $NH_3$ gas are adjusted depending on the Ta chemical vapor, but preferably supplied to flow amount of approximately 5 to 500 sccm. Especially, $O_2$ gas is, as a variable which adjusts dielectric constant of the TaON layer 43, supplied by adjusting dielectric constant appropriately in a range of 30 to 100. The amorphous TaON layer 43 is formed to a thickness of approximately 50 to 150 Å. At this time, when depositing the amorphous TaON layer 43, the TaON layer 43 can be deposited in series at atmosphere thereof after supplying first $NH_3$ gas and then nitrifying the surface of the lower electrode 40. Then, the interfacial oxidation of the TaON layer is prevented by nitrifying the surface of the lower electrode 40, thereby increasing interface affinity. At this time, a nitride thin film(not illustrated) is formed on the surface of the lower electrode 40 by the nitrifying step.

Figure 2C:
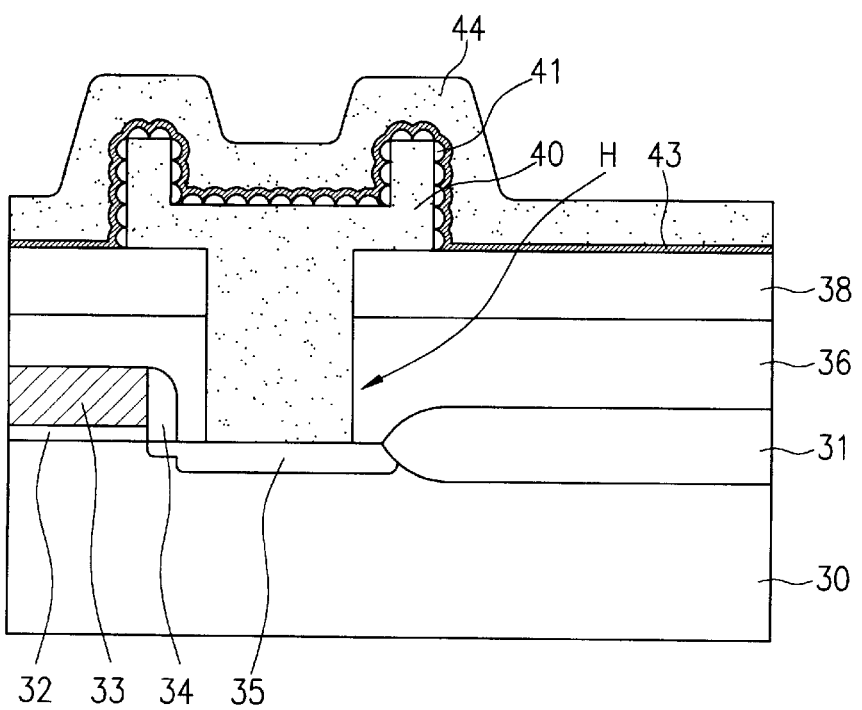

Afterwards, as illustrated in FIG. 2C, the amorphous TaON layer 43 is thermal-treated in a range of not changing the amorphous state, i.e. at a temperature of 300 to 600° C. to improve the property thereof. At this time, the thermal-treatment can be annealed at an atmosphere of plasma gas including nitrogen, for example $NH_3$, $N_2$, $N_2/H_2$ plasma gas or at an atmosphere of plasma gas including oxygen, for example $N_2O$ or $O_2$ gas. Structural defects and structural heterogeneity like micro cracks and pin holes on the surface of the TaON layer 43 are improved due to this plasma annealing process. At this time, when annealing, the TaON layer is maintained in an amorphous state because of the following reasons. A TaON layer in a crystalline state is generally is accompanied with a high thermal process, thereby increasing oxygen contents in the TaON layer while a TaON layer in an amorphous state is not accompanied with a high thermal process and therefore nitrogen contents in the TaON layer is relatively high. Consequently, dielectric constant in the amorphous state of relatively high nitrogen contents is higher than that in the crystalline state of relatively high oxygen contents. Accordingly, the thermal-treatment is performed without changing the amorphous state to ensure higher dielectric constant. Next, an upper electrode 44 is formed on the upper part of the TaON layer 43 to a selected thickness. Herein, the upper electrode 44 can be formed of a doped-polysilicon or a metal layer. At this time, one among TiN, TaN, W, WN, WSi, Ru, $RuO_2$, Ir, $IrO_2$ and Pt can be used as the metal layer. And, this metal layer 44 can be formed by a technique among LPCVD, PECVD, and RF magnetic sputtering technique. At this time, a barrier metal layer(not illustrated) can be additionally interposed before forming the upper electrode 44.

And, before depositing the amorphous TaON layer, a surface treatment of the lower electrode can be replaced with a plasma $NH_3$ gas annealing process or RTN process.

According to the present embodiment, as the amorphous TaON layer($\in$=30~100) having high dielectric constant against the crystalline TaON layer($\in$=20~26) is applied as a dielectric of a capacitor, capacitance of memory device is drastically increased.

And, the amorphous TaON layer has a stable bonding structure of Ta—O—N, thereby having a stable stoichiometry against the tantalum oxide layer. Therefore, the TaON layer 43 is has a superior tolerance against external electrical impacts and high breakdown voltage and very low leakage current. In addition, since the TaON layer has a stable structure, the oxide reaction between the lower electrode and the upper electrode is hardly generated. Accordingly, the thickness of an equivalent dielectric layer can be controlled to less than 35 Å thin.

In the aspect of manufacturing method, the TaON layer is formed in a single layer and only an annealing process is performed to stabilize the TaON layer after the deposition thereof. Consequently, the manufacturing process of this embodiment is simpler than that of the conventional tantalum oxide layer.

What is claimed is:

1. A method of manufacturing a capacitor on a semiconductor substrate comprising the steps of:

forming a lower electrode on the semiconductor substrate;

depositing an amorphous TaON layer as a dielectric layer on the upper part of the lower electrode;

thermal-treating the amorphous TaON layer in a range of maintaining the amorphous state; and forming an upper electrode on the upper part of the TaON layer.

2. The method according to claim 1, wherein the TaON layer is formed by a wafer surface chemical reaction of the Ta chemical vapor obtained from a precursor, $O_2$ gas and $NH_3$ gas with pressure of 0.1 to 100 Torr at temperature of 300 to 600° C. in an LPCVD chamber.

3. The method according to claim 2, wherein the Ta chemical vapor is obtained by fixing the dose of the precursor of more than 99.999% using a flow controller and then evaporating therein after injecting by 50 to 300 mg/min into an evaporizer or an evaporation tube.

4. The method according to claim 3, wherein the evaporizer or the evaporation tube is maintained at a temperature of 150 to 200° C.

5. The method according to claim 4, wherein the precursor is $Ta(OC_2H_5)_5$(tantalum ethylate) or $Ta(N(CH_3)_2)_5$(pental-dimethyl-amino-tantalum).

6. The method according to claim 2, wherein the $O_2$ gas and $NH_3$ gas are supplied in a range of 5 to 500 sccm.

7. The method according to claim 1, wherein a surface treatment is additionally performed between the step of forming the lower electrode and the step of depositing the TaON to prevent generation of a natural oxide layer on surface of the lower electrode.

8. The method according to claim 7, wherein the surface treatment of the lower electrode is cleaned by using HF vapor, HF solution or a compound containing HF.

9. The method according to claim 8, wherein an interface treatment is additionally performed by using $NH_4OH$ solution or $H_2SO_4$ solution before or after the cleaning step.

10. The method according to claim 1, further comprising the step of depositing the amorphous TaON layer, wherein the TaON layer is formed by supplying $O_2$ gas and Ta chemical vapor after first supplying $NH_3$ gas and then nitrifying the surface of the lower electrode.

11. The method according to claim 1, further comprising the step of annealing the amorphous TaON layer, wherein a resultant in which the amorphous TaON layer is deposited is annealed under an atmosphere of plasma gas containing nitrogen at a temperature of 300~600° C.

12. The method according to claim 1, wherein the amorphous TaON layer is annealed under an atmosphere of plasma gas containing oxygen at a temperature of 300~600° C.

13. A method of manufacturing a capacitor on a semiconductor memory device comprising the steps of:

forming a lower electrode on the semiconductor substrate;

surface-treating the lower electrode;

depositing an amorphous TaON layer as a dielectric layer on the upper part of the lower electrode;

thermal-treating the amorphous TaON layer in a range of maintaining the amorphous state; and forming an upper electrode on the upper part of the TaON layer, wherein the amorphous TaON layer is formed by a wafer surface chemical reaction of a Ta chemical vapor obtained from a precursor, $O_2$ gas and $NH_3$ gas with pressure of 0.1 to 100 Torr at a temperature of 300 to 600° C. in an LPCVD chamber.

14. The method according to claim 13, wherein the Ta chemical vapor is obtained by fixing the dose of the precursor of more than 99.999% using a flow controller and then evaporating therein after injecting into an evaporizer or an evaporation tube by 50 to 300 mg/min.

15. The method according to claim 14, wherein the precursor is $Ta(OC_2H_5)_5$(tantalum ethylate) or $Ta(N(CH_3)_2)_5$(pental-dimethyl-amino-tantalum).

16. The method according to claim 13, wherein the $O_2$ gas and $NH_3$ gas are supplied in a range of 5 to 500 sccm.

17. The method according to claim 13, the surface-treatment of the lower electrode is cleaned by using HF vapor, HF solution or a compound containing HF.

18. The method according to 17, wherein an interface treatment is additionally performed by using $NH_4OH$ solution or $H_2SO_4$ solution before or after the cleaning step.

19. The method according to claim 13, wherein $NH_3$ gas is supplied when surface treating the lower electrode, thereby nitrifying the surface of the same.

20. The method according to claim 13, further comprising the step of annealing the amorphous TaON layer, wherein a resultant in which the amorphous TaON layer is deposited is annealed under an atmosphere of plasma gas containing nitrogen at a temperature of 300 to 600° C.

21. The method according to claim 13, wherein the amorphous TaON layer is annealed under an atmosphere of plasma gas containing oxygen at a temperature of 300 to 600° C.

* * * * *